(12) United States Patent
Zecri

(10) Patent No.: US 9,389,119 B2
(45) Date of Patent: Jul. 12, 2016

(54) COMPACT DETECTION ARRAY HAVING IMPROVED POLARIZATION CONDITIONS

(71) Applicant: Société Française DE Détecteurs INFRAROUGES - SOFRADIR, Châtenay Malabry (FR)

(72) Inventor: Michel Zecri, Bévénais (FR)

(73) Assignee: SOCIETE FRANCAISE DE DETECTEURS INFRAROUGES—SOFRADIR, Chatenay Malabry (FR)

( * ) Notice: Subject to any disclaimer, the term of this patent is extended or adjusted under 35 U.S.C. 154(b) by 82 days.

(21) Appl. No.: 14/361,617

(22) PCT Filed: Nov. 30, 2012

(86) PCT No.: PCT/FR2012/000498
§ 371 (c)(1),
(2) Date: May 29, 2014

(87) PCT Pub. No.: WO2013/079826
PCT Pub. Date: Jun. 6, 2013

(65) Prior Publication Data
US 2014/0332663 A1 Nov. 13, 2014

(30) Foreign Application Priority Data
Dec. 2, 2011 (FR) ...................................... 11 03692

(51) Int. Cl.
*G01J 4/00* (2006.01)
*G01J 1/04* (2006.01)
(Continued)

(52) U.S. Cl.
CPC ................. *G01J 1/0429* (2013.01); *G01J 1/44* (2013.01); *H01L 27/14643* (2013.01); *H01L 27/14649* (2013.01); *H04N 5/33* (2013.01);
(Continued)

(58) Field of Classification Search
CPC ............. G01J 1/0429; H01L 27/14649; H01L 27/14643; H04N 5/3698; H04N 5/367; H04N 5/374
See application file for complete search history.

(56) References Cited

U.S. PATENT DOCUMENTS 6,188,070 B1 2/2001 Destefanis et al.
6,593,562 B1 7/2003 Parrish et al.
(Continued)

FOREIGN PATENT DOCUMENTS

EP 0 915 619 A1 5/1999
EP 1 677 353 A1 7/2006
(Continued)

*Primary Examiner* — Tony Ko
(74) *Attorney, Agent, or Firm* — Oliff PLC

(57) ABSTRACT

An array of photodetector is organized along a first organizational axis on a semiconductor substrate of a first conductivity type. Each photodetector is at least partially formed in the substrate which forms a first electrode of the photodetector. A peripheral polarization ring is formed around the array of photodetectors. The polarization ring is connected to a polarization voltage generator and to the substrate. A read circuit is connected to a photodetector via the second terminal of the photodetector. A first switch connects the photodetector to a generator of an additional voltage. A second switch connects the photodetector to the associated read circuit. The first and the second switches are in opposite states.

9 Claims, 2 Drawing Sheets

(51) Int. Cl.
*G01J 1/44* (2006.01)
*H01L 27/146* (2006.01)
*H04N 5/33* (2006.01)
*H04N 5/367* (2011.01)
*H04N 5/369* (2011.01)
*H04N 5/374* (2011.01)
*H01L 29/06* (2006.01)

(52) U.S. Cl.
CPC ............ *H04N 5/367* (2013.01); *H04N 5/3698* (2013.01); *H04N 5/374* (2013.01); *G01J 2001/448* (2013.01); *H01L 27/1463* (2013.01); *H01L 27/14625* (2013.01); *H01L 29/0619* (2013.01)

(56) References Cited

U.S. PATENT DOCUMENTS

| | | |
|---|---|---|
| 6,803,555 B1 | 10/2004 | Parrish et al. |
| 2001/0012133 A1 | 8/2001 | Yoneda et al. |
| 2002/0020845 A1 | 2/2002 | Ogura et al. |
| 2013/0099093 A1* | 4/2013 | Kawanabe ........ H01L 27/14665 250/208.1 |

FOREIGN PATENT DOCUMENTS

| | | |
|---|---|---|
| EP | 2 237 317 A1 | 10/2010 |
| WO | WO 98/15016 A1 | 4/1998 |

* cited by examiner

COMPACT DETECTION ARRAY HAVING IMPROVED POLARIZATION CONDITIONS

BACKGROUND OF THE INVENTION

The invention relates to a detection array comprising a plurality of photodetectors associated with a read device.

The invention also relates to a method of polarizing the substrate inside of the detection array.

STATE OF THE ART

In the field of detection devices, a photodetector is commonly associated with a read circuit. The photodetector delivers a signal representative of the observed scene and this signal is processed by the read circuit.

The photodetector polarization is obtained by means of the substrate potential imposed on a first terminal of the photodetector and by means of a reference potential imposed on the second terminal of the photodetector, by a read device of capacitive transimpedance amplifier type.

To obtain more information still relating to the observed scene, the photodetector has been replaced with a plurality of photodetectors. There further is a constant increase in the number of photodetectors integrated per surface area unit in a detection device, to increase the detector definition. However, integrating a large number of photodetectors raises manufacturing and operation issues.

To maintain a reasonable collection surface area and a low bulk of the device, the plurality of photodetectors is integrated in the form of an array. An electrically-conductive polarization ring surrounds the array to impose the substrate potential to the array photodetectors. There then is a large number of photodetectors organized in an array and all photodetectors are connected, more or less directly, to the substrate potential originating from the polarization ring.

Although this organization provides an undeniable gain in terms of integration density, it generates a difficulty in the polarization of the different photodetectors.

The photodetectors generally are photodiodes which are reverse-biased to deliver a current representative of the observed scene. The photodiode then behaves as a current generator. The photodiode polarization is applied on one side by the substrate and on the other by the read circuit. In such an operating state, the electric modeling of a photodiode in the array may be represented by a dynamic resistor assembled in parallel with the current generator and a series resistor assembled in series with the assembly.

However, the photodiode forming method is not perfect and/or the photodiode aging is not identical for all photodiodes, which results in a difference in the substrate polarization conditions as compared with the expected integration and/or in a time drift.

There then is a risk for at least one photodetector to no longer operate in its optimum operating range. This results in problems of linearity between the current provided by the photodetector and the incident flow. This type of problem is difficult or impossible to be corrected with image correction devices applied to the entire array.

Document US2001/0012133 describes a photodetector array. In certain embodiments, each pixel comprises a specific substrate polarization pad, which is particularly constraining since this strongly limits the integration density of such an architecture. In other embodiments, a full pixel line is sacrificed, which makes the scene analysis by processing circuits very difficult. In other embodiments, only certain pixels comprise a specific substrate polarization pad, which is as constraining as the embodiment with one polarization pad per pixel.

In document EP 1677353, the photodetectors are formed by PN junctions organized in an array. The array comprises a device for limiting crosstalk by means of a P-type doped area and of an N-type doped area.

SUMMARY OF THE INVENTION

The invention aims at a detection array which is more robust regarding photodetector behavior differences.

This result tends to be obtained by means of the appended claims, and more specifically by the fact that the array comprises
a semiconductor substrate of a first conductivity type:
an array of photodetectors organized along a first organizational axis, each photodetector being at least partially formed in the substrate forming a first terminal of the photodetectors,
a peripheral polarization ring formed around the array of photodetectors, the polarization ring being connected to a generator of a polarization voltage and to the substrate,
a plurality of read circuits, the read circuits being connected to a second terminal of the photodetectors,
a first switch connected between one of the read circuits and the second terminal of the associated photodetector to authorize or to block the transmission of electric current representative of an observed scene and,
a second switch connected between a generator of an additional voltage and the second terminal of said associated photodetector to apply the additional voltage to the second terminal, the first and second switches being in opposite states.

BRIEF DESCRIPTION OF THE DRAWINGS

The foregoing and other features and advantages of the present invention will more clearly appear from the following non-limiting description of specific embodiments of the invention, shown in the accompanying drawings, among which.

DESCRIPTION OF PREFERRED EMBODIMENT

Figure 1:
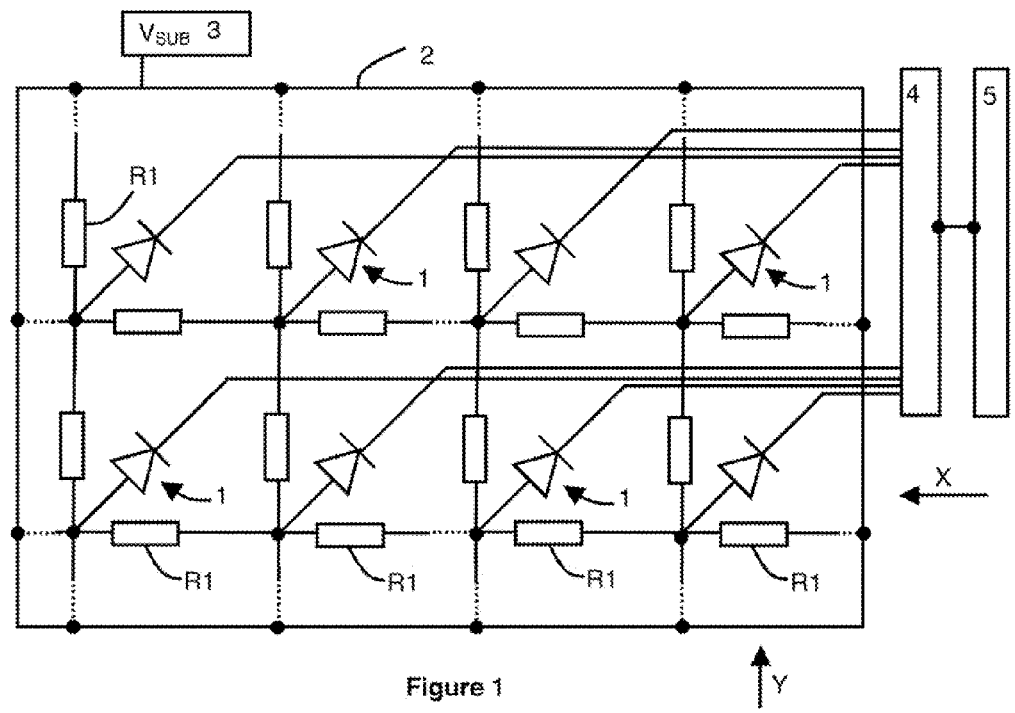
FIG. 1 schematically shows a detection device with a photodiode array.
Figure 2:
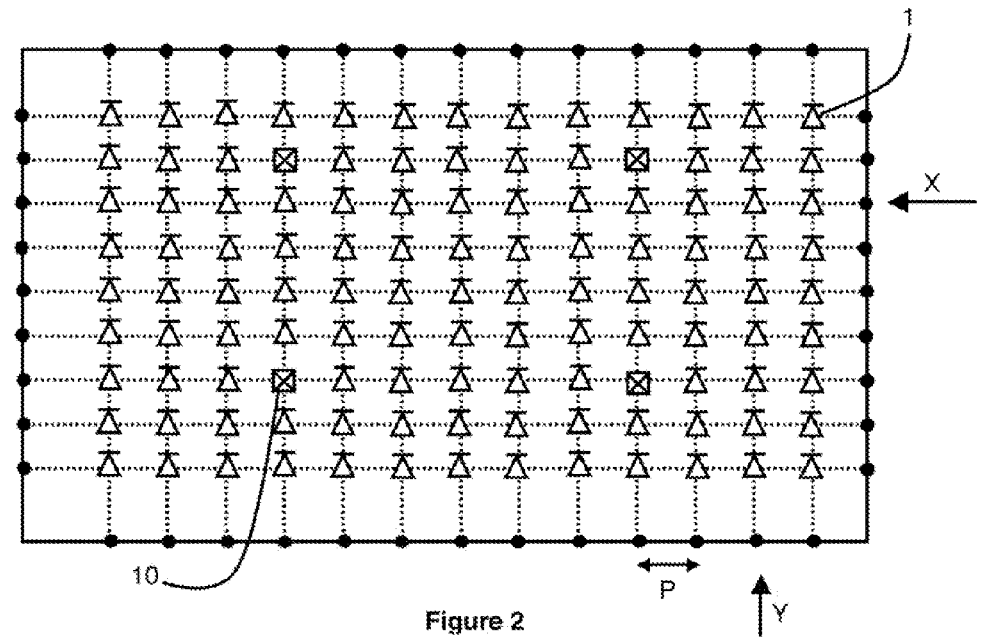
FIG. 2 schematically shows a specific organization of the photodiode array with internal polarization contacts.

As illustrated in FIGS. 1 and 2, the detection device comprises a plurality of photodetectors 1 which are organized in an array. Photodetectors 1 are organized along a first organizational axis X, that is. photodetectors 1 form a row or a column along this first axis X. The photodetector are organized along axis X with a repetition pitch P.

In a preferred embodiment illustrated in FIGS. 1 and 2, the plurality of photodetectors 1 is also organized along a second organizational axis Y which is secant to first organizational axis X. As an example, first organizational axis X is perpendicular to second organizational axis Y. Thereby, photodetectors 1 are organized with respect to one another along two different directions indicated by the first and the second organizational axis.

Thereby, photodetectors 1 are aligned along one or a plurality of lines parallel to axis X and they may be aligned along one or a plurality of lines parallel to axis Y. Photodetectors 1 are then organized in rows and columns. Other organizations of the array may also be envisaged, for example, with the integration of two photodetector arrays which use different technical characteristics.

Photodetector array 1 is formed on a substrate made of a semiconductor material and it is surrounded with a peripheral polarization line 2. Line 2 is a line of electrically-conductive material, for example, a metal line which runs at the substrate surface. In other embodiments, line 2 is a doped area of the substrate, this area is more heavily doped than the rest of the substrate to decrease the voltage drop along the line. Preferably, line 2 is a doped area which has the same conductivity type as the substrate. The substrate is of a first conductivity type, for example, type P.

In a preferred embodiment, peripheral line 2 is continuous around the photodetector array, but it could also be envisaged to have a discontinuous line. The polarization may also be imposed by means of two elementary lines arranged on two opposite edges of the array.

Peripheral polarization line 2 is connected to a polarization voltage generator 3. Polarization voltage $V_{SUB}$ or a close voltage is applied to photodetectors 1 via polarization line 2 and the substrate. Polarization voltage $V_{SUB}$ partly sets the photodetector polarization conditions by applying a first potential to a first terminal (electrode) of photodetector 1. Polarization voltage $V_{SUB}$ or a voltage related thereto is applied to the first terminal of the different photodetectors 1. A second voltage, a reference voltage, is applied to a second terminal (a second electrode) of the photodetectors to set the polarization conditions of the different photodetectors 1. Advantageously, the photodetectors are photodiodes reverse biased between polarization voltage $V_{SUB}$ and the reference voltage. The photodetectors may also be quantum well or multi-quantum well photodetectors (QWIP).

As an example, to define the photodetector polarization conditions, a second potential is applied via read circuit 4, which processes the signal emitted by photodetector 1. Read circuit 4 is connected to a circuit 5 for analyzing the information originating from the photodetector array or from a portion of the array, for example, a photodetector row or a photodetector column.

Figure 3:
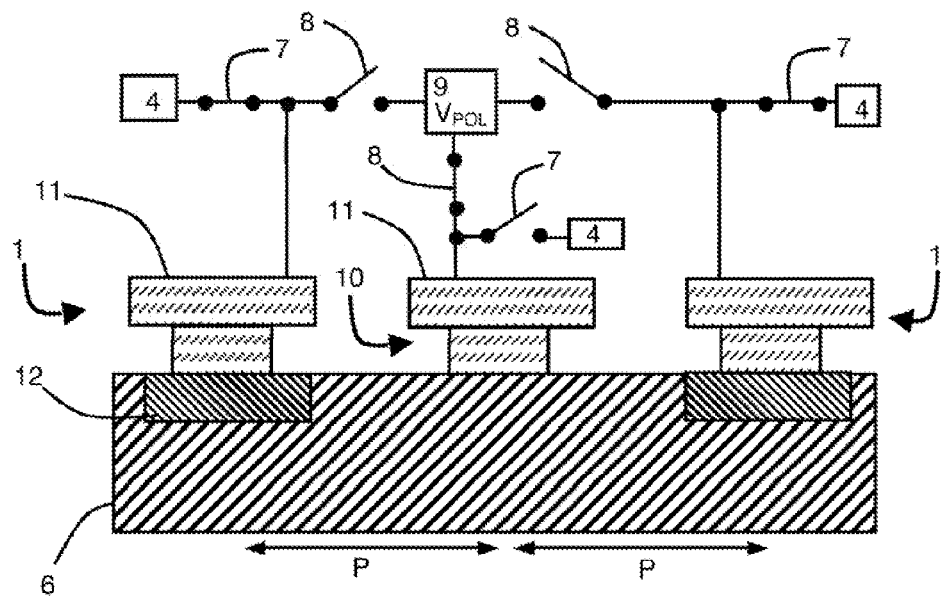
FIGS. 3 and 4 schematically show in cross-section view two photodetectors separated by an internal polarization contact and each connected to a read circuit.

In a preferred embodiment illustrated in FIG. 3, each photodetector 1 is at least partially formed by a portion of semiconductor substrate 6. For example, the first electrode is formed by substrate 6, which enables to ease the integration of the array into substrate 6 and to limit polarization differences. In a still more preferred embodiment, the photodetectors are formed in substrate 6. Photodetector 1 for example is a PN- or NP-type photodiode having its first electrode formed by substrate 6, which forms a first area of a first conductivity type. The second electrode is a second area of a second conductivity type which may also be formed by doping of substrate 6.

As an example, each photodetector 1 is associated with a read circuit 4 which imposes the reference voltage on the second electrode of photodetectors 1. In FIG. 1, the different read circuits 4 are gathered to form read means or a read device which comprises an array of read circuits. Each read circuit 4 is associated with one or a plurality of photodetectors 1. Each read circuit 4 recovers the electric signal emitted by one or a plurality of photodetectors. Preferably, a read circuit 4 is associated with a single photodetector, and conversely.

A read circuit 4 is associated with a photodetector via a first switch 7. Thereby, first switch 7 is connected to the second electrode of photodetector 1 and to the input terminal of read circuit 4.

The second electrode of photodetector 1 is associated with an additional voltage generator $V_{POL}$ via a second switch 8. Second switch 8 is in a state opposite to that of first switch 7 so that photodetector is polarized by means of the potential imposed by read circuit 4 or by means of additional voltage $V_{POL}$ originating from generator 9.

When second switch 8 is in the on state, photodetector 1 is, polarized between polarization voltage $V_{SUB}$ originating from substrate 1 and additional voltage $V_{POL}$. The polarization conditions across photodetector 1 are preferably selected so that photodetector 1 has a low impact on the other array photodetectors. The photodetector is not connected to read circuit 4.

In a specific embodiment, generator 9 of additional voltage $V_{POL}$ is generator 3 of polarization voltage $V_{SUB}$.

As an example, when polarization voltage $V_{SUB}$ is applied to the second electrode, photodetector 1 has the same potential on each of its terminals, which decreases or eliminates risks of leakage inside of the substrate via this photodetector.

When photodetector 1 is has a defect of short-circuit type, polarization potential $V_{SUB}$ is applied in the substrate inside of the array, which enables to improve the general array polarization conditions by promoting the application of voltage $V_{SUB}$ inside of the array. Polarization potential $V_{SUB}$ may also be applied to a photodetector in working condition, although, in this case, the photodetector no longer provides information relative to the observed scene.

This specific array architecture enables to simply and efficiently remove a defective photodetector 1 from the array all along its lifetime. The defective pixel is submitted to a set of potentials which decreases its electric effect with respect to the other photodetectors.

The detection of a defective photodetector may be performed by means of a plurality of different circuits. The detection circuit may be part of the analysis circuit which notices that the photodetector has an abnormal behavior, for example, it returns a fixed value. The detection circuit may be part of a secondary device. The detector observes a test chart and a processing circuit analyzes the information transmitted by the detector and it discriminates defective photodetectors. Such an architecture enables to follow the variations of photodetectors along time. This architecture is also very flexible regarding the photodetector organization and the substrate polarization contacts. When the photodetector organization is modified, it is not necessary to redesign the connection to the read circuits and to the polarization sources. It is sufficient to switch the state of a few switches.

Thus, in a simple way, adding two switches and an additional polarization line enable to process the information transmitted by the photodetector and to remove this photodetector when its performance is not compliant. The removal is performed with a minimum impact on the rest of the array.

For example, during the use of the photodetector array, the different photodetectors are verified to know their operating characteristics and/or to know the time variation of these characteristics. When the characteristics of a photodetector exceed a given threshold, the latter is considered as defective and it can be polarized by means of the additional generator, which can be assimilated to a hole in the detection array.

It can be observed that the series resistance of the photodetector induced by the substrate may cause a modification of the polarization across the photodetectors. Indeed, according to the intensity of the current generated by the current source, the voltage across the photodetector may vary. Further, due to the array organization of the different photodetectors, such voltage variations may cumulate and result in the depolarization of one or a plurality of photodetectors located in the central portion of the array and/or submitted to a significant light flow. In other words, in operation, the substrate is not always capable of transporting the charge carriers emitted by the different photodetectors 1 to polarization line 2, which translates as a variation of the polarization conditions of certain photodetectors 1 from the electrode coupled to the substrate.

Since the essential component of the depolarization is resistive, this depolarization risk is all the stronger as the current generated by the photodetector is high. It should also be noted that this phenomenon is all the stronger as the photodetector array is large and the resistance value is high.

In an alternative embodiment illustrated in FIG. 2, which may be combined with the previous embodiments, the device also comprises one or a plurality of electrically-conductive point contacts 10 which are connected, on the one hand, to the substrate and, on the order hand, to generator 9 of additional voltage $V_{POL}$, here generator 3 of polarization voltage $V_{SUB}$. Electrically-conductive contacts 10 are formed in photodetector array 1 at the location of a photodetector 1. Contact 10 is connected, via second switch 8, to a circuit of application of polarization voltage $V_{POL}$ to the substrate. Additional voltage $V_{POL}$ (here, $V_{SUB}$) is applied to substrate 6 by setting second switch 8 to the on state and first switch 7 to the off state.

Figure 4:
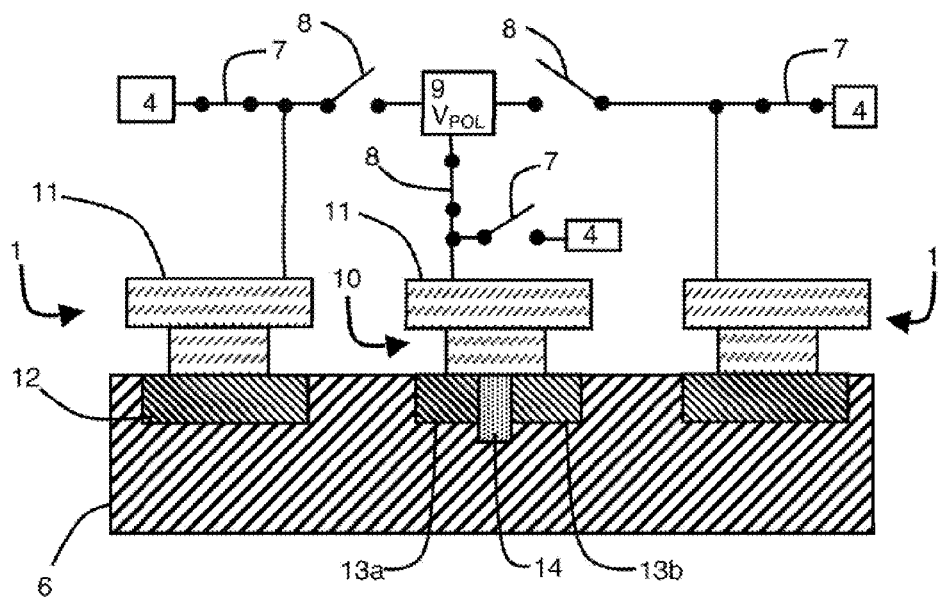

In the specific case illustrated in FIGS. 3 and 4, contact 10 connects generator 9 of additional voltage $V_{POL}$ to an area of the first conductivity type of substrate 6. Contact 10 comprises an electrically-conductive pad 11 which has an interface with an area of the first conductivity type of substrate 6 to directly apply additional voltage $V_{POL}$ in photodetector array 1. When generator 9 is formed by generator 3, contacts 10 act like direct contacts between substrate 6, which is an area of the first conductivity type, and generator 3 of polarization voltage $V_{SUB}$.

Thereby, contacts 10 are the relay of polarization line 2 inside of photodetector array 1. Contacts 10 enable to decrease the distance to be traveled by a charge emitted by photodetectors 1 to reach polarization voltage $V_{SUB}$ and be removed from substrate 6.

As illustrated in cross-section view in FIG. 3, contact 10 may be substantially identical to a photodetector 1. Contact 10 and photodetector 1 each comprise an electrically-conductive pad 11. In the case where photodetector 1 is a PN or NP diode, pad 11 is deposited on substrate 6 in the same way as for contact 10. The difference may exist in the doping of the immediately adjacent substrate.

For photodetector 1, one end of pad 11 is connected to read circuit 4. The other end of pad 11 is deposited on an area of the second conductivity type of substrate 6, which enables to polarize photodetector 1, here, the diode.

For contact 10, one end of pad 11 is connected to additional voltage generator 9. The other end of pad 11 is deposited on area 12 of the first conductivity type of substrate 6, which enables to directly apply additional voltage $V_{POL}$ to substrate 6, and not to a diode.

Since the architectures of contact 10 and of photodetector 1 are similar, common implementation steps may be used to ease the manufacturing and keep a high integration density. Pads 11 are formed without taking into account the local nature of substrate 6, that is, without knowing whether the substrate forms a contact 10 or a photodetector 1. The pad repetition pitch is constant.

In a specific embodiment where the photodetectors are diodes, it is possible to form contact 10 while protecting this substrate portion on forming of the area of the second conductivity type. Thereby, the substrate comprises a plurality of areas 12 of the second conductivity type, which will be used for the forming of photodetectors 1, and an area without this doping, which will be used for the forming of contact 10.

This technological step enables to form an array of areas 12 of the second conductivity type organized along a first alignment axis X and an area of the first conductivity type. The area of the first conductivity type is aligned with areas 7 of the second conductivity type, just as pads 11. The distance which separates the area of the first conductivity type from the closest two neighboring areas of the second conductivity type is equal to the repetition pitch existing between two consecutive areas of the second conductivity type and between pads 11. The repetition pitch is that of photodetectors 1 in the array.

Then, a common step of forming pads 11 is carried out. It is not necessary to take into account the fact that pad 11 may be formed for a contact 10 or for a photodetector 1. As an example, pads 11 have identical lateral dimensions (length and width) and they may be made of the same material. Pad 11 of electrically-conductive material is formed on the areas of the second conductivity type and the area of the first conductivity type.

Since electrically-conductive contact 10 is formed in place of a photodetector 1, contact 10 is aligned along first organizational axis X with the other photodetectors 1 of the same column or of the same row. A contact 10 has two photodetectors 1 as closest neighbors, on first organizational axis X. The distance which separates contact 10 from these closest two photodetectors 1 is equal to the distance which separates two adjacent photodetectors 1 along first organizational axis X. There is a constant repetition pitch P along the first organizational axis, repetition pitch P separating two consecutive elements, either two photodetectors 1, or a photodetector 1 and an electrically-conductive contact 10.

In a specific embodiment, two contacts 10 are adjacent and consecutive in one of the organization directions. This embodiment is less advantageous than two contacts 10 separated by a few photodetectors.

Contact 10 is perfectly integrated in the photodetector array, its bulk is identical to that of a photodetector.

Preferably, if a plurality of contacts 10 are formed in photodetector array 1, contacts 10 are distributed at regular intervals along first organization axis X. The distance separating two contacts 10 is an integral multiple of repetition pitch P of the array along first axis X, which may define a first repetition pitch specific to contacts 10. The repetition distance is selected to avoid for the polarization conditions of photodetectors 1 to be modified beyond a threshold value.

The repetition distance of contacts 10 can thus be defined from the device sizing phase according to the applied polarization conditions, to the maximum applicable illumination conditions, and to the electric properties of substrate 6.

Since electrically-conductive contact 10 is formed in place of a photodetector 1, no additional element is integrated into the array. This solution can thus be integrated in arrays where the repetition pitch is small, for example, for a repetition pitch P smaller than 30 μm, more advantageously for a repetition pitch P smaller than or equal to 15 μm.

The use of an electrically-conductive contact 10 or of a plurality of electrically-conductive contacts in photodetector array 1 enables to make the device more robust against depolarization risks, for example, when the device is submitted to a significant light flow.

Since a photodetector 1 is replaced with an electrically-conductive contact, there exists a detection area providing no information relative to the observed scene. This informationless area corresponds to an isolated pixel. Due to processing means, it is possible to compensate for this lack of information by using the information provided by its immediate neighbors. This type of correction is not possible or cannot easily be performed when a polarization sub-line is used and sacrifices an entire column or row of photodetectors 1.

Thus, in an advantageous embodiment, the device comprises means for generating an illumination signal from photodetectors 1 adjacent to contact 10. According to the embodiments, from four to eight adjacent photodetectors may be used to generate a signal artificially originating from contact 10. Thereby, the device transmits a signal (for example, an image) representative of the observed scene while removing the dark areas created by contact(s) 10.

In the detection array, the hole may be assimilated to a defective photodetector 1 having a position which is known in advance, which eases the management of the corrections to be made to have a piece of information associated with each coordinate of the array, be this area occupied by a photodetector 1 or by a contact 10.

Photodetectors 1 and/or contacts 10 are connected to a first conductive line which recovers the information delivered by the array. The first line of metallic material connects photodetector 1 to read circuit 4. Read circuit 4 stores the information delivered by the photodetector and it may also be involved in the polarization of photodetector 1. Each photodetector 1 provides an electric signal (a voltage or a current) which is representative of the observed scene. This signal is conveyed by an electric line to data processing means via read circuit 4. Different types of read circuits are possible, for example, direct-injection circuits (DI), buffered direction injection circuits (BD), or capacitive transimpedance amplifier circuits (CTIA).

The photodetectors and/or contacts 10 are also connected to a second conductive line which imposes a specific potential without having the processing of the information transmitted by the photodetector.

In this architecture, the photodetectors and contacts 10 are associated with an additional polarization line, which enables to polarize the array elements with a first potential or with a second potential.

A functional photodetector 1 is normally polarized with a first potential (for example, the reference potential imposed by the read circuit) and it is connected to read circuit 4 to be able to process the delivered information. A defective photodetector 1 is normally polarized with a second potential to decrease its influence on adjacent pixels. Since the pixel is defective, it is no longer necessary to process the transmitted data.

A contact 10 is normally polarized with the second potential to promote the removal of the charges emitted by the photodetectors directly inside of the array. Since contact 10 transmits no signal according to the received illumination, it should not be connected to read circuit 4.

In a specific embodiment, one or a plurality of photodetectors of the array are associated with a read circuit 4 and with additional voltage generator 9. Preferably, the selected photodetectors 1 are those having the highest probability of failure.

In a preferred embodiment, each photodetector is associated with a read circuit 4 and with additional voltage generator 9. This specificity enables to perform corrections in the entire array. Each photodetector has a second electrode which is connected to an input of a read circuit 4.

In a preferred embodiment, which may be combined with the previous embodiments, the second electrode of each photodetector 1 is connected to generator 3 of polarization voltage $V_{SUB}$ by a second switch 8. Photodetector 1 is connected to read circuit 4 by a first switch 7 which is in a state opposite to that of switch 8. The integration is similar over the entire array of read circuits 4, which makes the integration process easier. The circuit is the same for all photodetectors.

The same is true when contacts 10 are integrated in the array, which enables to have one and the same read and processing circuit 4 which may be associated with different arrays of photodetectors/contacts.

Just like the photodetector, contact 10 is connected to a read circuit 4 by a first switch 7 and to additional voltage generator 9 by a second switch 8. The first and second switches are in opposite states.

The use of an electrically-conductive contact 10 connected to polarization voltage generator 3 is particularly advantageous when substrate 6 has a high resistivity as compared with the illumination conditions accepted by photodetectors 1. As an example, it is advantageous to use one or a plurality of electrically-conductive contacts 10 when the substrate is P-type doped since the conduction of charge carriers is not as good as for N-type doped substrates. Such an architecture enables to form avalanche photodiodes in the array or next to the array, which is not possible by inverting the doping types. These embodiments are particularly advantageous in the case where substrate 6 is a material based on CdHgTe having electric characteristics which may not be sufficient to integrate arrays of significant size.

The use of an electrically-conductive contact 10 connected to polarization voltage generator 3 is particularly advantageous when the size of the photodetector array is significant.

The use of an electrically-conductive contact 10 connected to the polarization voltage generator is particularly advantageous when photodetectors 1 are associated with large wavelengths of the infrared spectrum (8-15 μm), which results in the management of a high quantity of charge carriers in the substrate.

As compared with a conventional polarization ring which would divide the array into a plurality of sub-arrays, the electrically-conductive contact avoids losing an entire column or row of photodetectors. In this case, the obtained array is more compact, that is, it comprises a larger number of photodetectors per surface area unit.

Photodetector array 1 may comprise a plurality of photodetector rows and/or a plurality of photodetector columns. Electrically-conductive contacts 10 may be formed over a plurality of different rows or columns. Thus, a same row or a same column of photodetectors may comprise a plurality of electrically-conductive contacts 10. In another embodiment, a same row or a same column comprises no more than one contact 10 to decrease the impact of the contact on the information provided by the row and/or the column and thus to decrease the impact on the information processing.

In another specific embodiment, photodetector array 1 may comprise different organizations of photodetectors 1, for example, the photodetectors present on two successive rows or columns may be shifted to gain compactness. The first and second organizational directions are not necessarily perpendicular.

This architecture is particularly advantageous in the case of a bispectral array where two types of photodetectors are integrated. Each type of photodetector reacts with a specific wavelength. For this type of device, the substrate comprises a plurality of layers which react to different wavelengths, which make the heavily-doped layer disclosed in document WO 98/15016 A1 difficult to use. The two types of photodiodes may have different sizes and/or different influences on the electric properties of the substrate.

In the case where the photodetectors are PN- or NP-type diodes, there are two areas of opposite conductivity types with a common interface.

Advantageously, substrate 6 is of the first conductivity type and areas 12 of a second conductivity type are formed inside of the substrate. To have a plurality of independent diodes, areas 12 of the second conductivity type are spaced apart from one another.

However, each diode has a surface for collecting the generated carriers which is larger than the surface occupied by area 12 of the second conductivity type. In other words, the carriers generated outside of the diode may be attracted and collected by the diode. In other words, in top view, the carrier collection surface extends beyond the edges of the surface of the second conductivity type.

In a specific embodiment, to have a maximum collection of the light energy emitted by the observed scene, the collection areas between two adjacent photodetectors 1 overlap. In this overlapping area common to two photodetectors, the generated charge carriers have the possibility of being captured by one or the other of photodetectors 1.

Advantageously, photodetectors 1 have identical architectures and identical polarization conditions to ease the processing of the information transmitted by each photodetector 1 as compared with the other photodetectors 1 of the array. In this case, photodetectors 1 are considered as identical in terms of architecture as well as of operation. Photodetectors 1 has the same effective collection surface area.

In the case where contact 10 comprises a pad 11 deposited on an area of the first conductivity type and having no area of the second conductivity type, no diode or collection area forms. The photodetectors 1 adjacent to a contact have no overlapping area with contact 10 and then have an effective collection surface area which is greater than for the other photodetectors 1. There is a difference in the operation of such photodetectors 1 due to the charge carrier collection surface area which is greater than that of the other photodetectors in the array.

This operating singularity makes the information processing more difficult by artificially creating areas brighter than in reality. This effect is all the stronger as the overlapping area is large in the charge carrier collection surface.

To make the photodetectors more homogeneous with the rest of the array population, electrically-conductive contact 10 advantageously comprises a ring-shaped doped area 13 of the second conductivity type with, at its center, the substrate and/or a doped area 14 of the first conductivity type which is in electric continuity with the substrate. Thereby, electrically-conductive contact 10 comprises a central area of the first conductivity type and a peripheral area of the second conductivity type. Area 13 of the second conductivity type does not totally surround the area of the first conductivity type so that polarization voltage $V_{SUB}$ can be directly applied to the substrate, rather than via a diode.

Doped area 13 of the second conductivity type simulates the operation of a photodiode with a collection surface area and creates an overlapping area between contact 10 and each of the adjacent photodetectors 1. This overlapping area decreases the effective collection surface area of photodetectors 1.

Pad 11 is in electric contact with area 14 of the first conductivity type and with area 13 of the second conductivity type. Area 14 may be a portion of the substrate or a portion of area 13 which has been subsequently doped with an opposite type to change conductivity.

In a preferred embodiment, the distance separating the outer edge of ring-shaped doped area 13 of the second conductivity type and doped area 12 of the second conductivity type of photodetector 1 is identical to the distance separating two doped areas 12 of the second conductivity type of two adjacent photodetectors along the first organizational axis. The central area and the peripheral area of contact 10 have opposite conductivity types and these two areas are shorted by means of an electrically-conductive material, for example, a metal, preferably by pad 11 connected to the additional voltage generator.

This architecture enables to avoid the forming of a diode between the central area and the peripheral area of contact 10, which adversely affects the proper operation of contact 10. This also enables to use peripheral area 13 to decrease the collection surface area of adjacent photodetectors 1 while polarizing substrate 10 to the additional voltage, preferably polarization voltage $V_{SUB}$ by means of the central portion of pad 10.

In a specific embodiment, the central portion of contact 10, that is, area 14, in the substrate has a greater dopant concentration than the rest of substrate 6.

This specific architecture may be simply achieved by forming the array of PN or NP diodes in the substrate. Areas 12 of the photodiodes and area 13 are formed during the same technological step, although they may also be formed separately. Then, a doped area 14 of the first conductivity type is formed in area 13 of the second conductivity type to form a direct connection between substrate 6 of the first conductivity type and pad 11 of contact 10. It is also possible to change the area forming order, for example, by forming area 14 first, and then forming areas 12 and 13.

Then, pads 11 are formed conventionally, like the rest of the device forming method. The pads are for example metal balls which are used for the inter-connection with a second substrate comprising the read unit.

This additional step enables to simply and economically transform a photodetector of PN or NP diode type into a polarization contact directly integrated inside of the array.

Generally, contact 10 comprises an area 14 of the first conductivity type and an area 13 of the second conductivity type. These two areas are adjacent and shorted to be polarized to the same potential, here polarization potential $V_{SUB}$. First area 14 of the first conductivity type is in doping continuity with the rest of substrate 6. Thereby, first area 14 cannot be formed and fully delimited in a well of the second conductivity type. The conductivity type is constant from first area 14 all the way to the substrate. Second area 12 may partially or totally laterally surround first area 14 to have an effect on one or a plurality of collection surfaces of the adjacent areas. A plurality of areas 13, here, areas 13a and 13b, distinct from one another, may be formed in front of one or several photodetectors to modify the overlapping area.

The detector comprises means for applying the polarization voltage directly to an area of the first conductivity type which is in doping continuity with the substrate and to an area of the second conductivity type. This enables to form a diode having a lateral influence which will decrease the collection surface area of at least one adjacent photodetector.

The invention claimed is:

1. A detection device comprising:
   a semiconductor substrate of a first conductivity type,
   an array of photodetectors organized along a first organizational axis, each photodetector being at least partially formed in the semiconductor substrate, said semiconductor substrate forming a first terminal of the photodetectors,
   a peripheral polarization ring formed around the array of photodetectors, the polarization ring being connected to the substrate and to a generator configured for providing a polarization voltage,
   a plurality of readout circuits connected to a second terminal of the photodetectors,
   a first switch connected between one of the readout circuits and the second terminal of the associated photodetector so as to authorize or to block transmission of an electric current representative of an observed scene emitted by the photodetector,
   a second switch connected between a second generator configured for providing an additional voltage and the second terminal of said associated photodetector so as to apply the additional voltage to the second terminal, the first and second switches being in opposite states, and
   an electrically-conductive contact connected to the semiconductor substrate by an area in doping continuity with the semiconductor substrate,
   wherein the electrically-conductive contact is connected to one of the readout circuits by a first switch and to the second generator by a second switch so as to apply the additional voltage to the semiconductor substrate, the first and second switches being in opposite states, and
   wherein the electrically-conductive contact is arranged between two photodetectors in the first organization axis, the distance separating the electrically-conductive contact from each of the two photodetectors being equal to the distance separating two adjacent photodetectors along the first organizational axis.

2. The device according to claim 1, wherein the second generator is the first generator.

3. The device according to claim 1, wherein each photodetector has a second terminal connected to an input of one readout circuit.

4. The device according to claim 3, wherein the second terminal of each photodetector is connected to the second generator by a second switch, the photodetector being connected to the associated readout circuit by a first switch being in an opposite state.

5. The device according to claim 1, wherein the second switch is in an on state.

6. The device according to claim 5, comprising a plurality of electrically-conductive contacts connected to the semiconductor substrate along the first organization axis, the electrically-conductive contacts being arranged between the photodetectors at regular intervals, according to a first repetition pitch which is a multiple of a repetition pitch of the photodetectors.

7. The device according to claim 1, comprising a plurality of electrically-conductive contacts connected to the semiconductor substrate along the first organization axis, the electrically-conductive contacts being arranged between the photodetectors at regular intervals, according to a first repetition pitch which is a multiple of a repetition pitch of the photodetectors.

8. The device according to claim 1, wherein the photodetectors are formed by a first doped area of a second conductivity type in the semiconductor substrate to form a P/N- or N/P-type junction and wherein the electrically-conductive contact comprises no first doped area.

9. The device according to claim 1, wherein the photodetectors are formed by a first doped area of a second conductivity type in the semiconductor substrate to form a P/N- or N/P-type junction and wherein the electrically-conductive contact comprises a second doped area of the first conductivity type shorted with a third doped area of the second conductivity type.

* * * * *